United States Patent
Chen et al.

(10) Patent No.: US 9,627,288 B2
(45) Date of Patent: Apr. 18, 2017

(54) PACKAGE STRUCTURES AND METHODS OF FORMING THE SAME

(71) Applicant: Taiwan Semiconductor Manufacturing Co., Ltd., Hsin-Chu (TW)

(72) Inventors: Hsien-Wei Chen, Hsinchu (TW); Wei-Yu Chen, New Taipei (TW); Cheng-Hsien Hsieh, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/724,811

(22) Filed: May 29, 2015

(65) Prior Publication Data

US 2016/0351463 A1   Dec. 1, 2016

(51) Int. Cl.
| H01L 23/31 | (2006.01) |
| H01L 23/00 | (2006.01) |
| H01L 23/48 | (2006.01) |
| H01L 25/065 | (2006.01) |
| H01L 21/56 | (2006.01) |
| H01L 21/78 | (2006.01) |
| H01L 21/48 | (2006.01) |

(52) U.S. Cl.
CPC ........ *H01L 23/3121* (2013.01); *H01L 21/486* (2013.01); *H01L 21/56* (2013.01); *H01L 21/78* (2013.01); *H01L 23/481* (2013.01); *H01L 24/13* (2013.01); *H01L 25/0657* (2013.01); *H01L 2224/13147* (2013.01); *H01L 2225/06548* (2013.01); *H01L 2225/06572* (2013.01)

(58) Field of Classification Search
CPC ... H01L 23/3121; H01L 24/13; H01L 23/481; H01L 25/0657; H01L 21/78; H01L 21/486; H01L 21/56; H01L 2225/06572; H01L 2224/13147; H01L 2225/06548
USPC .......................................... 257/737
See application file for complete search history.

(56) References Cited

U.S. PATENT DOCUMENTS

| 2012/0161315 A1 | 6/2012 | Lin et al. |
| 2013/0001776 A1* | 1/2013 | Yu .................... H01L 23/481 |
| | | 257/738 |

(Continued)

FOREIGN PATENT DOCUMENTS

| CN | 101425500 | 5/2009 |
| TW | 201436163 | 9/2014 |

OTHER PUBLICATIONS

"Office Action of Taiwan Counterpart Application," issued on Oct. 13, 2016, p. 1-p. 6, in which the listed references were cited.

*Primary Examiner* — Fernando L Toledo
*Assistant Examiner* — Adam S Bowen
(74) *Attorney, Agent, or Firm* — Jianq Chyun IP Office

(57) ABSTRACT

Package structures and methods of forming the same are disclosed. A package structure includes a die, a dielectric layer, an encapsulant and a plurality of supports. The die includes, over a first side thereof, a plurality of connectors. The dielectric layer is formed over the first side of the die aside the connectors. The encapsulant is aside the die. The supports penetrate through the dielectric layer. The grinding rate of the supports is substantially the same as that of the encapsulant but different from that of the dielectric layer.

16 Claims, 18 Drawing Sheets

(56) References Cited

U.S. PATENT DOCUMENTS

2014/0103488 A1* 4/2014 Chen ................. H01L 24/83
257/532
2014/0367160 A1 12/2014 Yu et al.

* cited by examiner

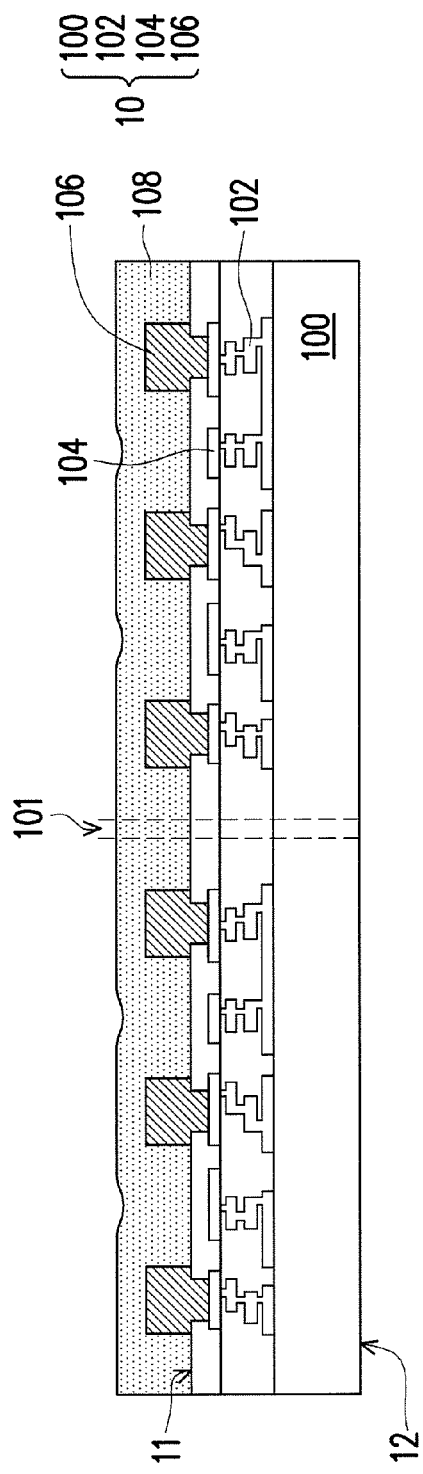
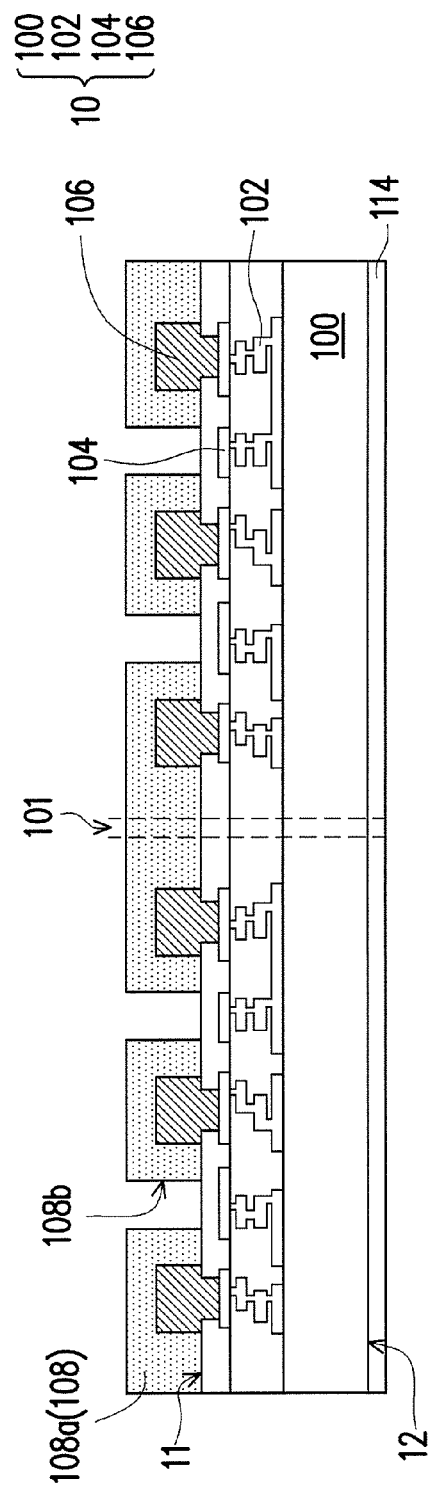
FIG. 1A
FIG. 1B

PACKAGE STRUCTURES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. A grinding or polishing step is one of the main steps in a package manufacturing process. To achieve better control on the grinding uniformity of a package structure is the attention focus in the industry.

BRIEF DESCRIPTION OF THE DRAWINGS

FIG. 1A to FIG. 1G are cross-sectional views of a method of forming a package structure in accordance with some embodiments.

DETAILED DESCRIPTION

Figure 1C:
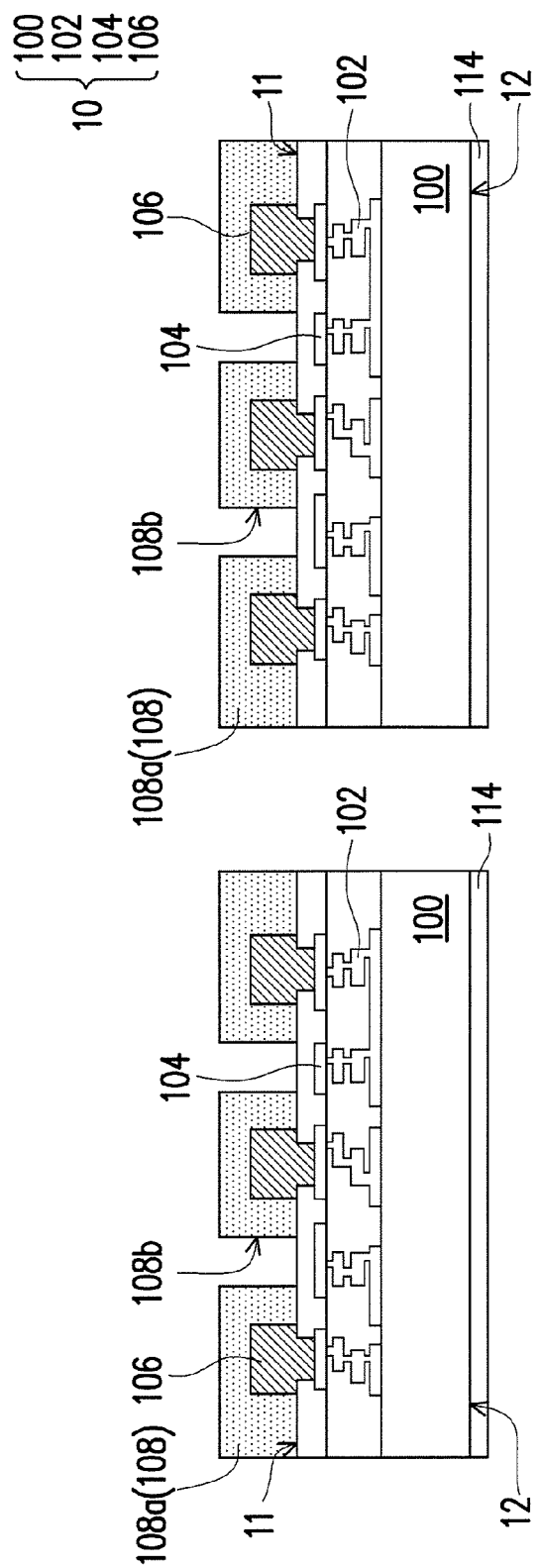

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath," "below," "lower," "on," "over," "above," "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are cross-sectional views of a method of forming a package structure in accordance with some embodiments.

Referring to FIG. 1A, a wafer is provided with a plurality of dies 10 arranged in an array. Each die 10 includes an interconnection 102, a metal wire 104 and a plurality of connectors 106. The interconnections 102 are formed over a substrate 100. The substrate 100 includes, for example but not limited to, bulk silicon, doped or undoped, or an active layer of a semiconductor-on-insulator (SOI) substrate. The metal wires 104 are formed over and electrically connected to the interconnections 102. A scribe region 101 is located between two adjacent dies 10.

The connectors 106 are formed over and electrically connected to a portion of the metal wires 104. In some embodiments, the connectors 106 are formed as the top portions of the dies 10. The connectors 106 protrude from the remaining portions or lower portions of the dies 10. Throughout the description, the sides of the dies 10 with the connectors 106 are referred to as front sides or first sides 11. Besides, the connectors 106 can be electrical connectors, dummy connectors or both. The connectors 106 include solder bumps, gold bumps, copper posts or the like. In some embodiments, the connectors 106 are copper bumps. The term "copper posts" refers to copper protrusions, copper pillars, thick copper pads and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Thereafter, a dielectric layer 108 is formed over the first sides 11 of the dies 10 to cover the connectors 106 and fill gaps between the connectors 106. In some embodiments, the dielectric layer 108 includes a photo-sensitive material such as polybenzoxazole (PBO), polyimide, benzocyclobutene (BCB), a combination thereof or the like, which may be easily patterned using a lithography mask. In alternative embodiments, the dielectric layer 108 includes a nitride such as silicon nitride, an oxide such as silicon oxide, phosphosilicate glass (PSG), borosilicate glass (BSG), boron-doped phosphosilicate glass (BPSG), a combination thereof or the like. The dielectric layer 108 may be formed by suitable fabrication techniques such as spin-coating, chemical vapor deposition (CVD), plasma-enhanced chemical vapor deposition (PECVD) or the like.

Referring to FIG. 1B, the dielectric layer 108 is patterned to form a plurality of dielectric patterns 108a and a plurality of gaps 108b between the dielectric patterns 108a. In some embodiments, the dielectric patterns 108a respectively cover the tops and sidewalls of the connectors 106, and the gaps 108b between the dielectric patterns 108a expose a portion of the first sides 11 of the dies 10. In some embodiments, the connectors 106 over the first sides 11 of the dies 10 are, for example, encapsulated by the dielectric patterns 108a. The patterning step includes performing a photolithography process or performing photolithography and etching processes. In some embodiments, the scribe regions 101 between the adjacent dies 10 are covered by the dielectric layer 108 (or dielectric patterns 108a), as shown in FIG. 1B. In alternative embodiments, parts of the gaps 108b of the dielectric layer 108 expose the scribe regions 101 between the adjacent dies 10.

The steps in FIG. 1A and FIG. 1B are performed in a wafer stage. In some embodiments, after the formation of the dielectric patterns 108a and before the die singulation process, an adhesive layer 114 is formed over the back sides or second sides 12 opposite to the first sides 11 of the dies 10, as shown in FIG. 1B. The adhesive layer 114 includes a die attach film (DAF), silver paste, or the like.

Referring to FIG. 1C, a dicing or singulation process is performed along the scribe regions 101 to separate the dies 10 from each other. In some embodiments, the adhesive layer 114 on the second sides 12 of the dies 10 are cut off during the die singulation process. A cutting machine used for separating the dies 10 along the scribe regions 101 typically involves dicing with a rotating blade or a laser beam. In other words, the dicing or singulation process is, for example, a laser cutting process or a mechanical cutting process.

Figure 1D:
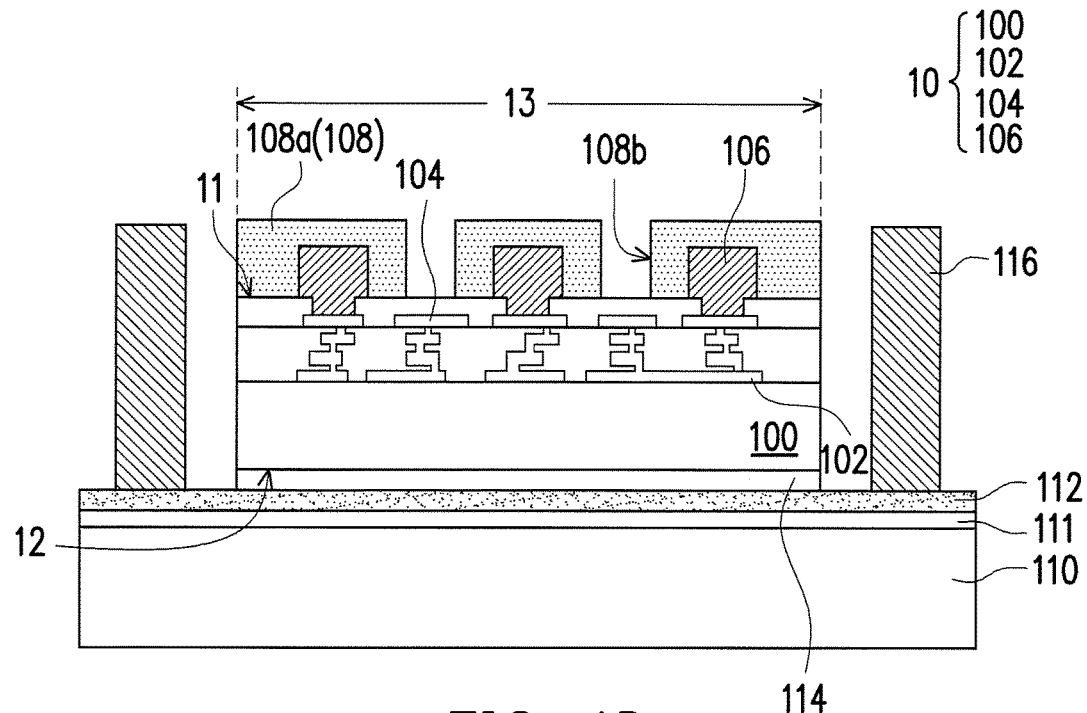

After the dicing or singulation process is performed, as an example illustrated in FIG. 1D, one of the dies 10 is placed over a carrier 110. The carrier 110 is provided with a glue layer 111 formed thereon. The carrier 110 may be a blank glass carrier, a blank ceramic carrier, or the like. The glue layer 111 may be formed of an adhesive such as an Ultra-Violet (UV) glue, a Light-to-Heat Conversion (LTHC) glue, or the like, although other types of adhesives may be used. In some embodiments, the glue layer 111 is decomposable under the heat of light to thereby release the carrier 110 from the structure formed thereon.

A dielectric layer 112 is formed over the glue layer 111. In some embodiments, the dielectric layer 112 is a polymer layer. The polymer includes, for example, polyimide, PBO, BCB, Ajinomoto Buildup Film (ABF), Solder Resist film (SR), or the like. The dielectric layer 112 is formed by suitable fabrication techniques such as spin-coating, lamination, deposition or the like.

In some embodiments, the back side or second side 12 opposite to the first side 11 of the die 10 is attached to the carrier 110. In some embodiments, the adhesive layer 114 over the second side 12 of each die 10 is attached to the dielectric layer 112 over the carrier 110.

Thereafter, a plurality of through vias 116 is formed over the carrier 110 aside or around the die 10. In some embodiments, the through vias 116 are formed over the dielectric layer 112. The through vias 116 include copper, nickel, solder, a combination thereof or the like. In some embodiments, the through vias 116 further include barrier layers to prevent metal diffusion. The exemplary formation method of the through vias 116 includes forming a photoresist layer such as a dry film resist over the carrier 110. Thereafter, openings are formed in the photoresist layer, and the through vias 116 are then formed in the openings with electroplating. Afterwards, the photoresist layer is stripped. In some embodiments, the tops of the through vias 116 are substantially level with the tops of the dielectric patterns 108a. In alternative embodiments, the tops of the through vias 116 are lower or higher than the tops of the dielectric patterns 108a.

Figure 1E:
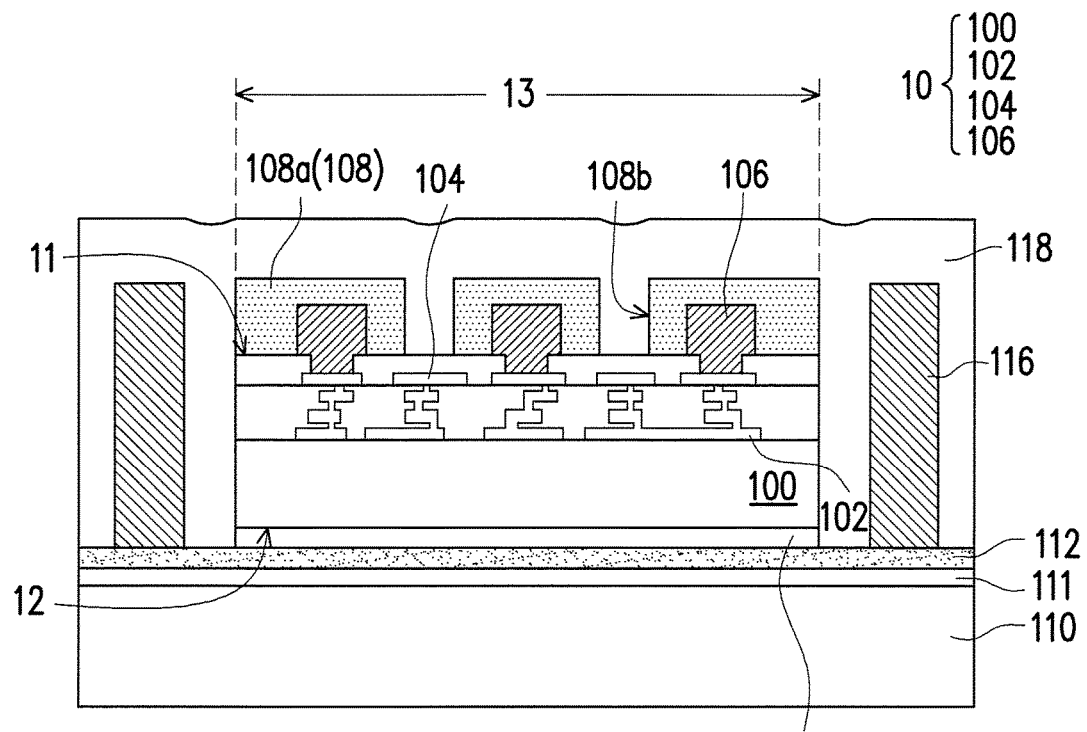

Referring to FIG. 1E, an encapsulant 118 is formed over the carrier 110 to encapsulate the die 10 and fill the gaps 108b between the dielectric patterns 108a. In some embodiments, the encapsulant 118 encapsulates the through vias 116 and encapsulates the top and sidewall of the die 10. Specifically, the encapsulant 118 covers tops and sidewalls of the dielectric patterns 108a and completely fills the gaps 108b between the dielectric patterns 108a, covers the sidewall of the die 10, and simultaneously covers the tops and sidewalls of the through vias 116.

In an embodiment, the encapsulant 118 includes a molding compound, a molding underfill, a resin or the like, such as epoxy. The encapsulant 118 may be formed by suitable fabrication techniques such as spin-coating, lamination, deposition or the like. In some embodiments, the encapsulant 118 includes a photo-sensitive material such as polybenzoxazole (PBO), polyimide, benzocyclobutene (BCB), a combination thereof or the like, which may be easily patterned using a lithography mask. In alternative embodiments, the encapsulant 118 includes a nitride such as silicon nitride, an oxide such as silicon oxide, phosphosilicate glass (PSG), borosilicate glass (BSG), boron-doped phosphosilicate glass (BPSG), a combination thereof or the like.

The encapsulant 118 has a grinding rate different from that of the dielectric layer 108 (or dielectric patterns 108a). A grinding rate is defined as a thickness of a film removed per unit time. In some embodiments, a grinding rate is measured when a film formed on a substrate is polished or ground under a predetermined pressure. The grinding rate is affected by various process factors such as the composition of the polishing or grinding slurry, the hardness and/or the design of the polishing or grinding wheel, the hardness and/or the material of the film, etc.

In an embodiment, a grinding process is performed on the resulted structure. In some embodiments, a polish process is performed after the grinding process. In some embodiments, the encapsulant 118 is polished or ground more slowly than the dielectric layer 108 (or dielectric patterns 108a). In alternative embodiments, the encapsulant 118 is polished or ground more quickly than the dielectric layer 108. In some embodiments, the encapsulant 118 and the dielectric layer 108 include different materials with different grinding rates.

Figure 1F:
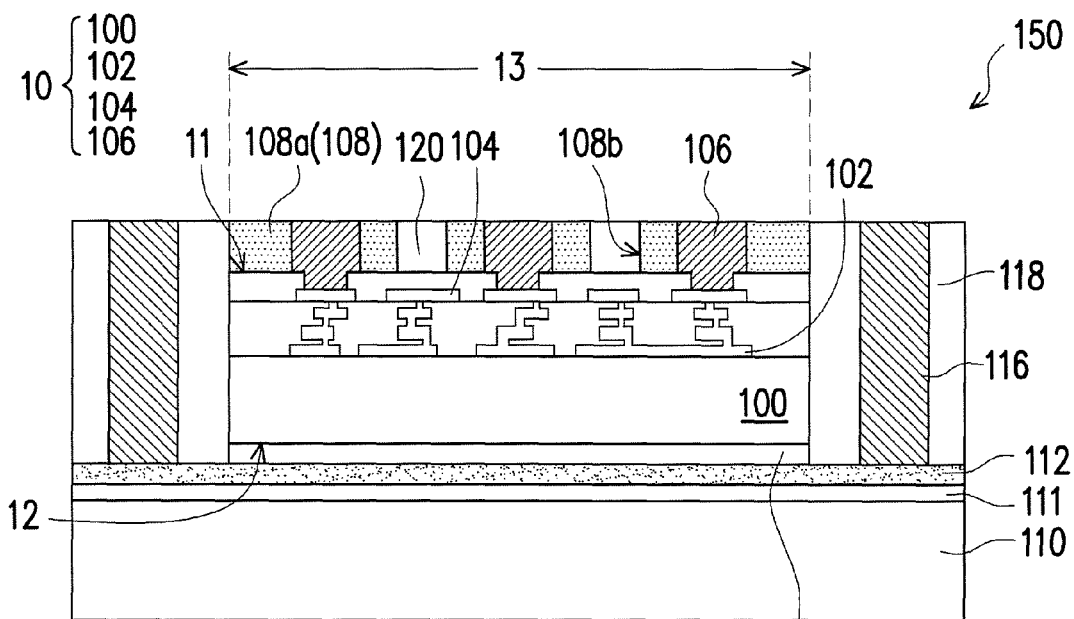

Referring to FIG. 1F, a portion of the encapsulant 118 is removed until tops of the connectors 106 are exposed, so that supports 120 are provided respectively in the gaps 108b between the dielectric patterns 108a. Specifically, a grinding or polishing process is performed to remove a portion of the encapsulant 118 and a portion of the dielectric patterns 108a by using the connectors 106 as a polishing or grinding stop layer, and therefore the remaining or thinned encapsulant 118 between the remaining dielectric patterns 108a forms the supports 120 respectively in the gaps 108b. In some embodiments, the upper portions of the connectors 106 and the through vias 116 are simultaneously removed during the grinding or polishing process, so as to remove the undesired oxide or polymer residues on the upper surfaces of the connectors 106 and the through vias 116.

In some embodiments, the supports 120 are formed from the encapsulant 118, so the supports 120 and the encapsulant 118 are made of the same material having substantially the same grinding rate, as shown in steps of FIG. 1E and FIG. 1F. In alternative embodiments (e.g., the embodiments of FIG. 3A to FIG. 3H), the supports and the encapsulant are formed from different materials but exhibit substantially the same grinding rate.

Upon the grinding or polishing process, the tops of the encapsulant 118, the supports 120 and the connectors 106 are substantially coplanar. In some embodiments, the tops of the supports 120, the connectors 106 and the dielectric patterns 108a within the die region 13 (i.e., the region occupied by the die 10) are substantially level with the tops of the encapsulant 118 and the through vias 116 outside the die region 13. The package structure 150 of the present disclosure is thus completed.

Figure 1G:
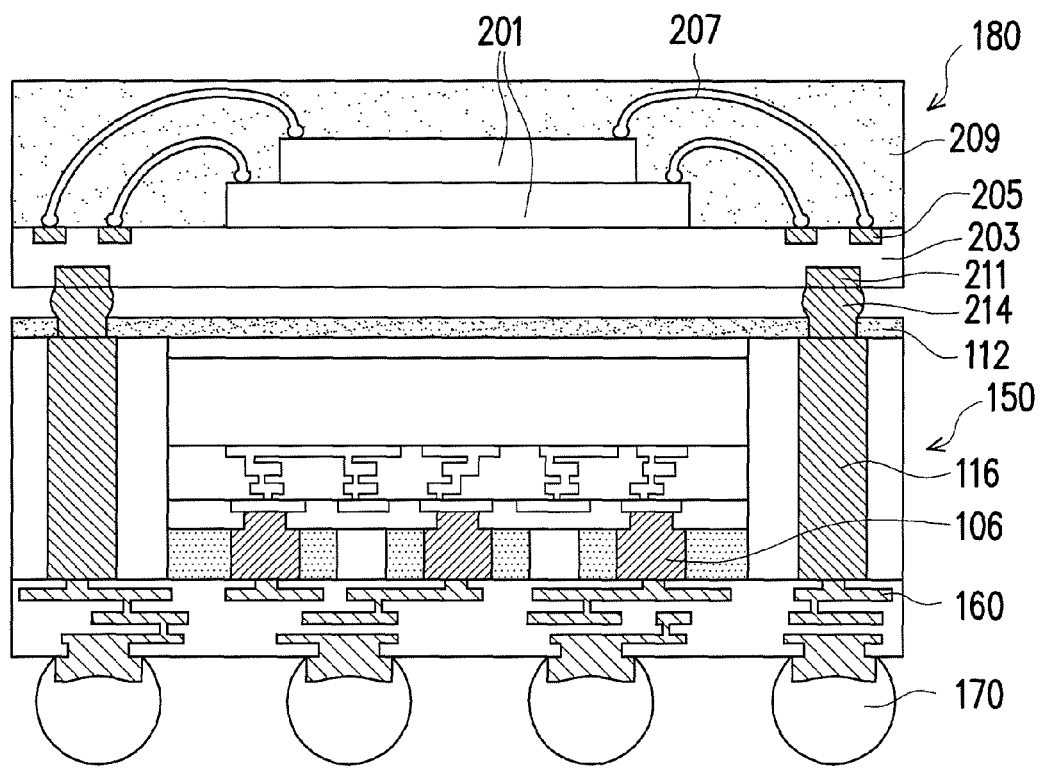

Referring to FIG. 1G, a metal wire 160 serving as a Redistribution Layer (RDL) is formed to electrically connect to the connectors 106 of the package structure 150, and balls 170 are formed to electrically connect to the metal wire 160. The package structure 150 with the metal wire 160 and the balls 170 are turned over, the glue layer 111 is decomposed under heat of light, and the carrier 110 is then released from the package structure 150. Thereafter, the dielectric layer 112 is patterned to form a plurality of openings therein.

Thereafter, another package structure 180 is provided. In some embodiments, another package structure 180 has a substrate 203, and a die 201 is mounted on one surface (e.g., top surface) of the substrate 203. Bonding wires 207 are used to provide electrical connections between the die 201 and a set of bonding pads 205 in the top surface portion of the substrate 203. An encapsulant 209 is formed over the components to protect the components from the environment and external contaminants. Through vias (not shown) may be used to provide electrical connections between the bonding pads 205 and another set of bonding pads 211 in the bottom surface portion of the substrate 203. A plurality of connectors 214 such as solder balls is formed on an opposite surface (e.g., bottom surface) of the substrate 203 to electrically connect to the bonding pads 211.

In some embodiments, the package structure 150 of the present disclosure can be connected to another package structure 180, so as to form a package-on-package (PoP) device. Specifically, the connectors 214 of another package structure 180 is aligned and inserted into the openings in the dielectric layer 112 and therefore is electrically connect to the through vias 116 of the package structure 150.

Figure 2:
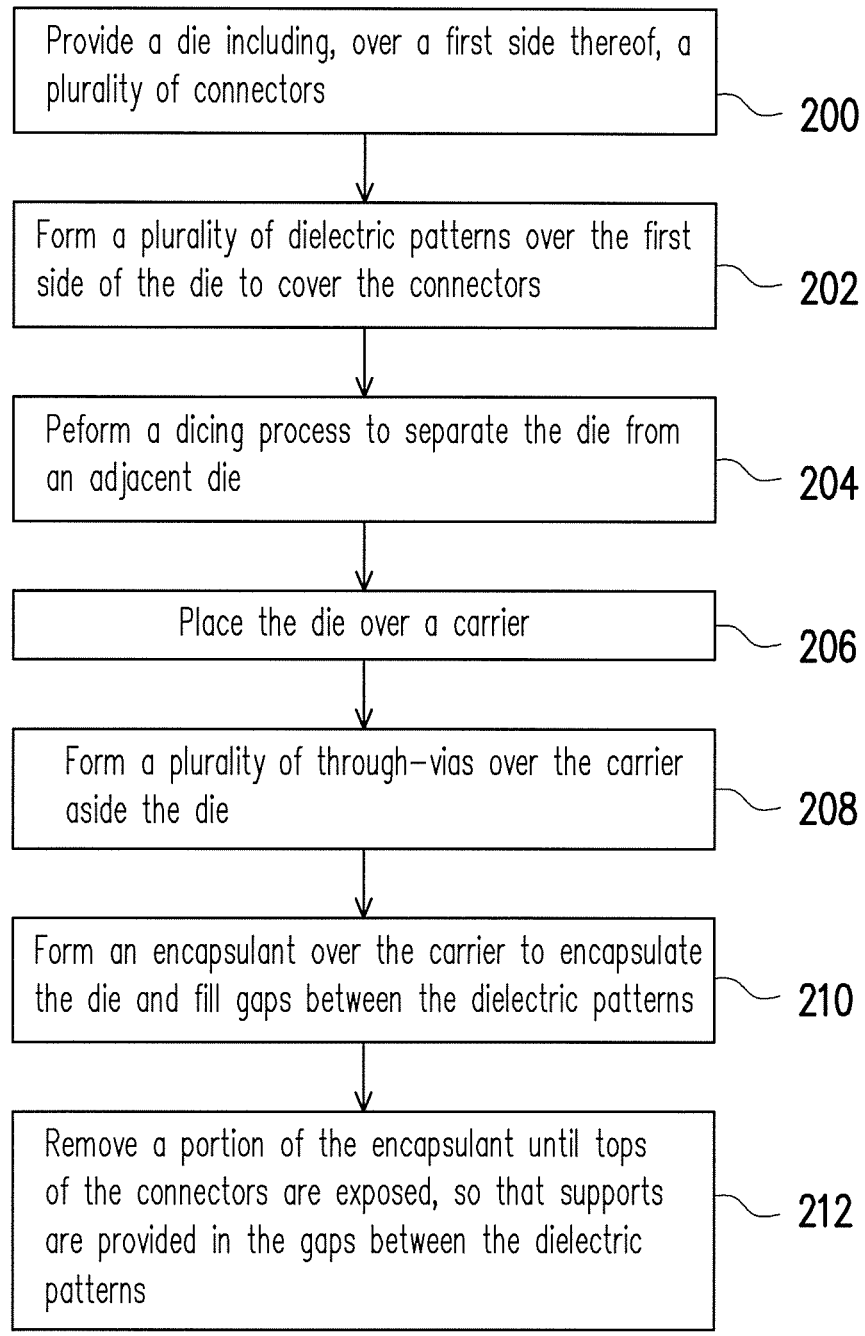
FIG. 2 is a flow chart illustrating a method of forming a package structure in accordance with some embodiments.

The said process steps of FIG. 1A to FIG. 1F can be concisely illustrated with reference to the flow chart of FIG. 2.

At step 200, a die 10 is provided. The die 10 includes, over the first side 11 thereof, a plurality of connectors 106. At step 202, a plurality of dielectric patterns 108a are formed over the first side of the die 10 to cover the connectors 106, as shown in FIG. 1B. At step 204, a dicing process is preformed to separate the die 10 from an adjacent die 10, as shown in FIG. 1C. At step 206, the die 10 is placed over the carrier 110, as shown in FIG. 1D. At step 208, a plurality of through vias 116 is formed over the carrier 110 aside the die 10, as shown in FIG. 1D. At step 210, an encapsulant 118 is formed over the carrier 110 to encapsulate the die 10 and fill gaps 108b between the dielectric patterns 108a, as shown in FIG. 1E. At step 212, a portion of the encapsulant 118 is removed until the tops of the connectors 106 are exposed, so that the supports 120 are provided in the gaps 108b between the dielectric patterns 108a, as shown in FIG. 1F.

It is noted that in some embodiments, the total of the top areas of the supports 120 is more than about 30 percent or 50 percent of the total top area of the die 10. The total top area of the die 10 is defined as the area of the die region 13. In other words, the top area ratio of the supports 120 to the die 10 is more than about 0.30 or 0.50. In some embodiments, the top area ratio of the supports 120 to the die 10 can be, for example but is not limited to, about 0.30, 0.35, 0.40, 0.45, 0.50, 0.55, 0.60, 0.65, 0.70, 0.75, 0.80, 0.85, 0.90, 0.95, including any range between any two of the preceding values and any range more than any one of the preceding values. In some embodiments, the top area ratio of the supports 120 to the die 10 is such as to improve the grinding or polishing uniformity.

Specifically, the supports 120 inside the die region 13 and the encapsulant 118 outside the die region 13 are provided with similar grinding rate and the top surfaces of the supports 120 against or contacting the polishing or grinding wheel are maximized as much as possible. In such manner, the polishing or grinding wheel is subjected to less variation in the grinding rate during operation. Therefore, the conventional dishing effect is greatly mitigated or not observed. The polishing uniformity is accordingly improved and the life time of the polishing or grinding wheel is prolonged.

FIG. 3A to FIG. 3H are cross-sectional views of a method of forming a package structure in accordance with some embodiments. FIG. 4 is a flow chart illustrating a method of forming a package structure in accordance with some embodiments. The difference between the method of FIG. 3A to FIG. 3H and the method of FIG. 1A to FIG. 1G lies in the forming sequence of the supports. The difference is illustrated in details below, and the similarity is not iterated herein.

Figure 3A:
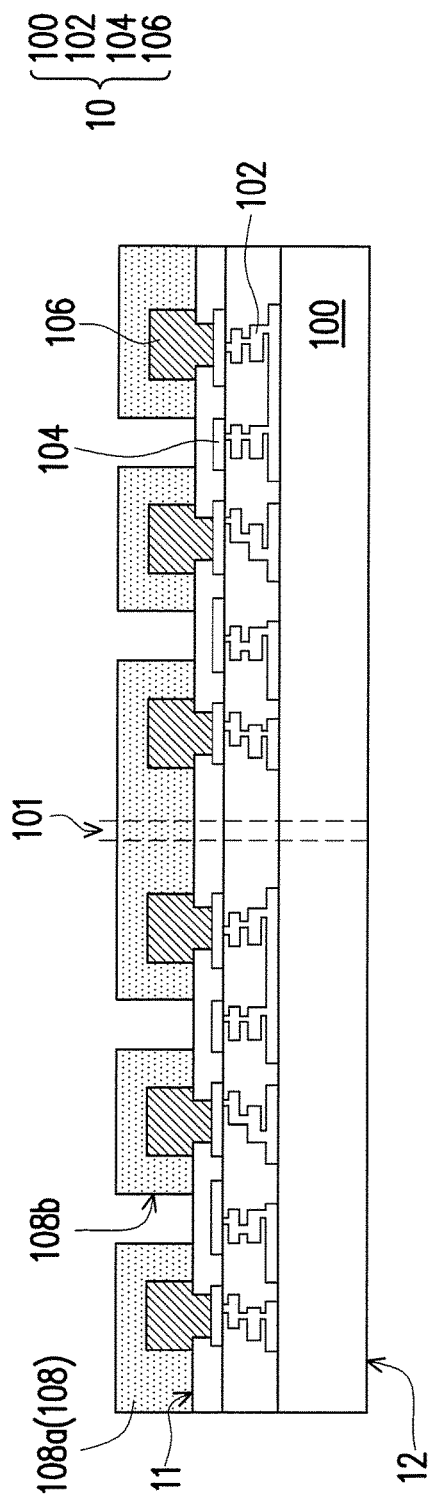
FIG. 3A to FIG. 3H are cross-sectional views of a method of forming a package structure in accordance with some embodiments.
Figure 4:
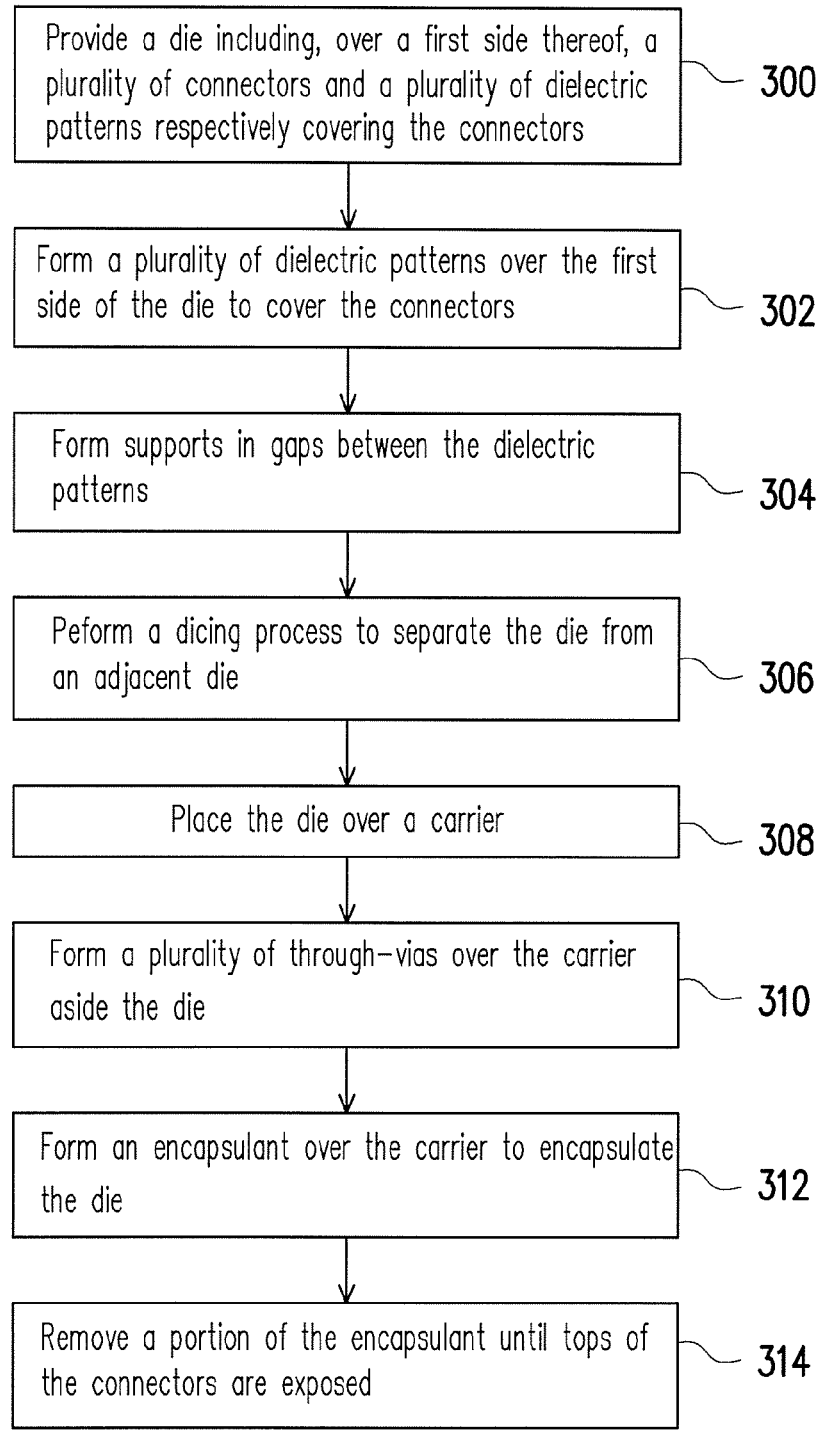
FIG. 4 is a flow chart illustrating a method of forming a package structure in accordance with some embodiments.

Referring to FIG. 3A and FIG. 4, an intermediate structure as shown in FIG. 1B is provided. A wafer is provided with a plurality of dies 10, and each die 10 includes, over a first side 11 thereof, a plurality of connectors 106 (step 300). Thereafter, a plurality of dielectric patterns 108a is formed over the first side 11 of the die 10 to respectively cover the connectors 106 (step 302).

Figure 3B:
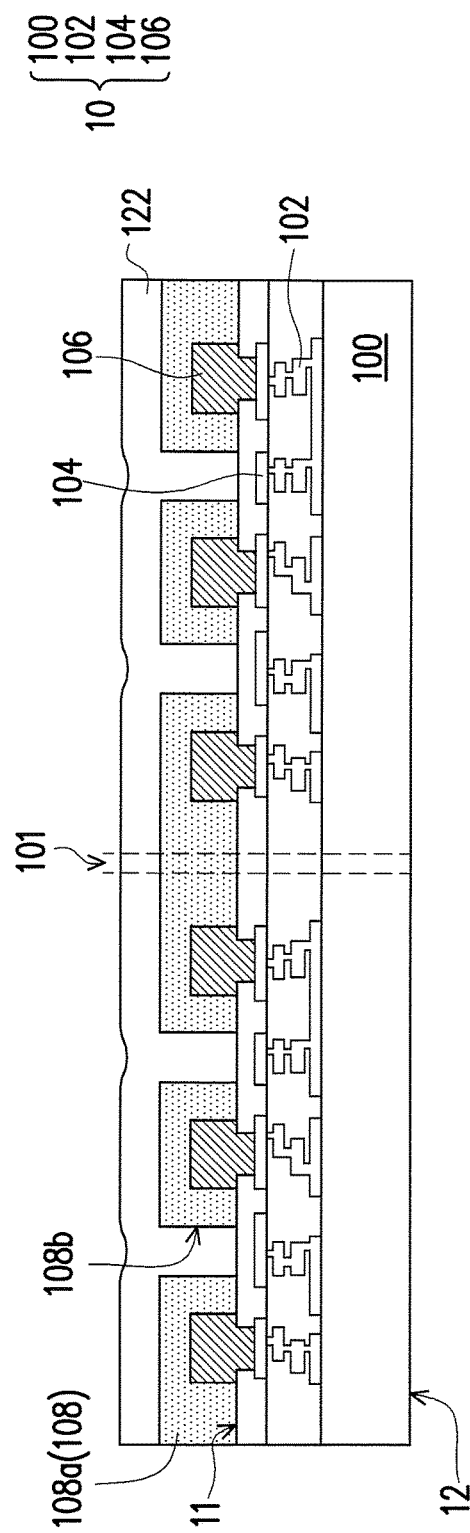
Figure 3C:
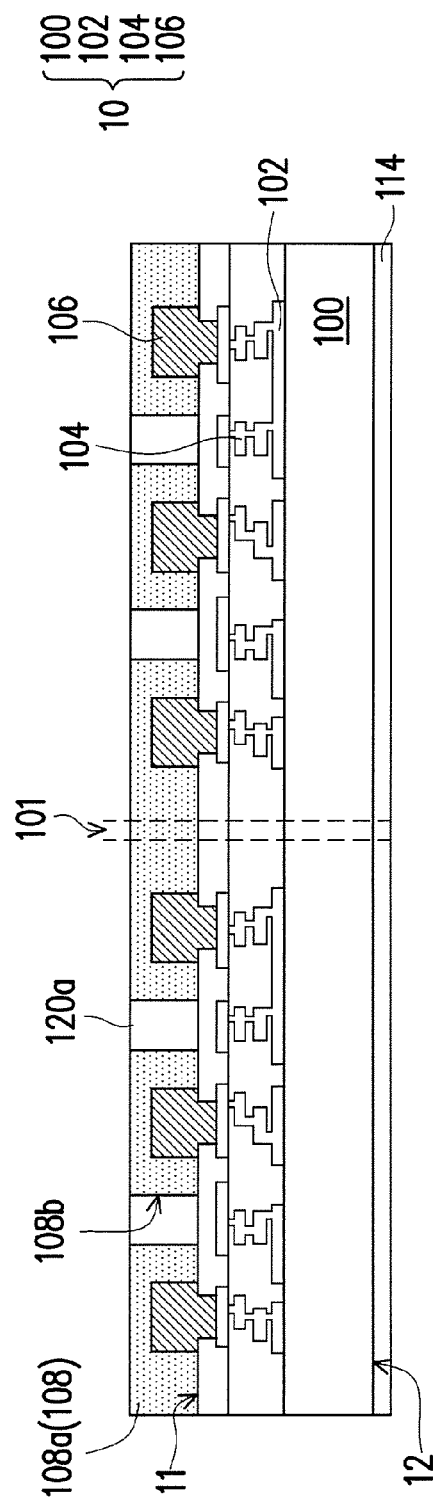

Referring to FIG. 3B, FIG. 3C and FIG. 4, supports 120a are formed respectively in gaps 108b between the dielectric patterns 108a (step 304). The supports 120a include a dielectric material different from that of the dielectric patterns 108a. In some embodiments, the supports 120a include a nitride such as silicon nitride, an oxide such as silicon oxide, phosphosilicate glass (PSG), borosilicate glass (BSG), boron-doped phosphosilicate glass (BPSG), a combination thereof or the like. The exemplary formation method of the supports 120a includes depositing a dielectric material layer 122 over the substrate 100 filling the gaps 108b between the dielectric patterns 108a (as shown in FIG. 3B), and then removing a portion of the dielectric material layer 122 with a chemical mechanical polishing (CMP) process by using the dielectric patterns 108a as a polishing stop layer (as shown in FIG. 3C). Upon the CMP process, the tops of the dielectric patterns 108a and the supports 120a are substantially coplanar.

The grinding rate of the supports 120a is different from that of the dielectric patterns 108a. In some embodiments, the supports 120a are polished or ground more slowly than the dielectric patterns 108a. In alternative embodiments, the supports 120a are polished or ground more quickly than the dielectric patterns 108a.

The steps in FIG. 3A to FIG. 3C are performed in a wafer stage. In some embodiments, after the formation of the dielectric patterns 108a and the supports 120a and before the die singulation process, an adhesive layer 114 such as a DAF is formed over the back sides or second sides 12 of the dies 10, as shown in FIG. 3C.

Figure 3D:
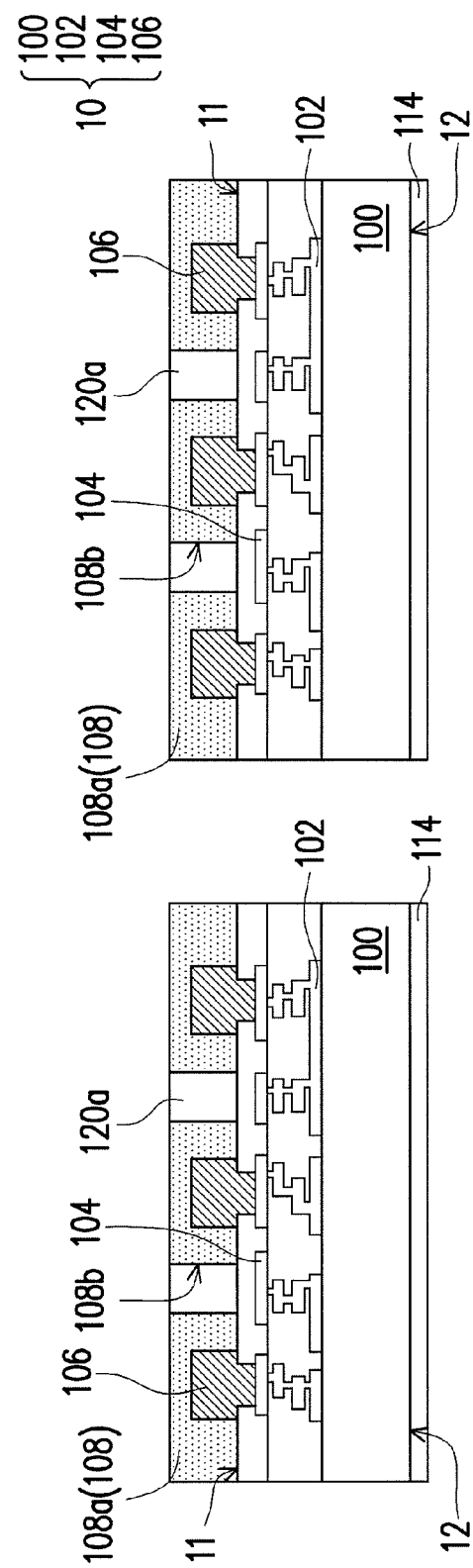

Referring to FIG. 3D and FIG. 4, a dicing process is preformed to separate the die 10 from an adjacent die 10 (step 306).

Figure 3E:
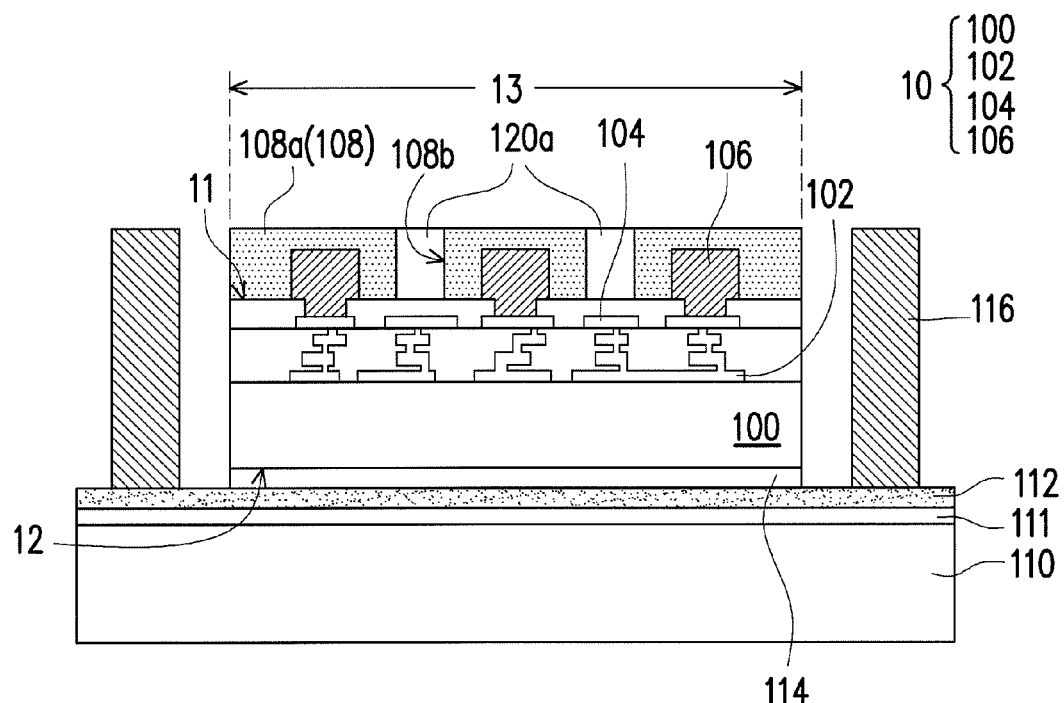

Referring to FIG. 3E and FIG. 4, the die 10 is placed over the carrier 110 (step 308). Thereafter, a plurality of through vias 116 is formed over the carrier 110 aside the die 10 (step 310).

Figure 3F:
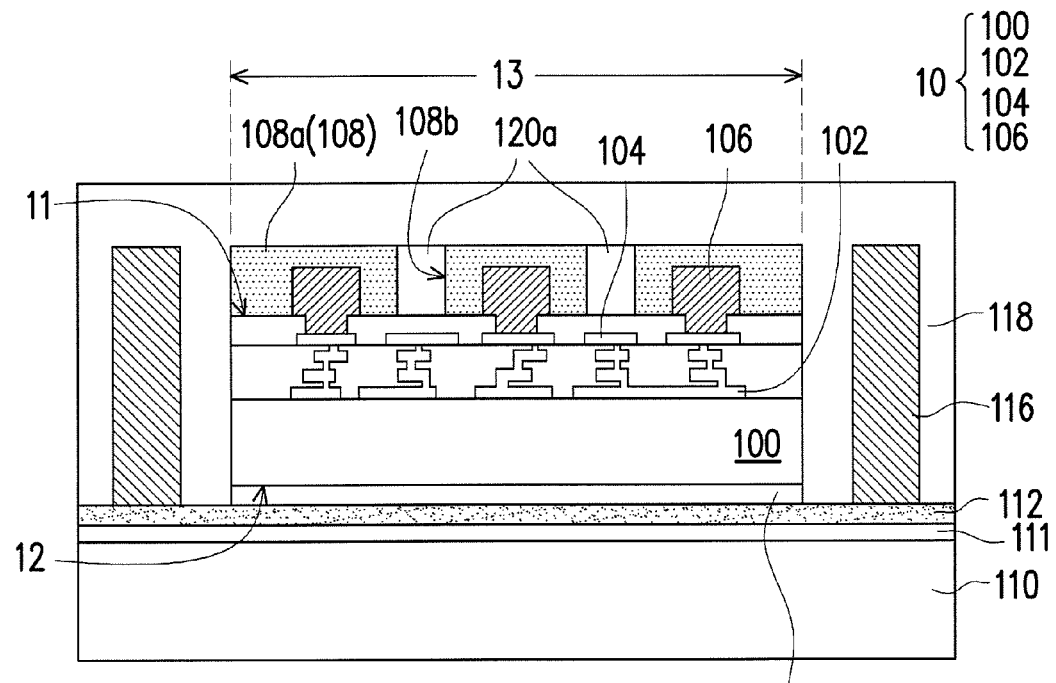

Referring to FIG. 3F and FIG. 4, an encapsulant 118 is formed over the carrier 110 to encapsulate the die 10 (step 312). In some embodiments, the encapsulant 118 encapsulates the through vias 116 and encapsulates the top and sidewall of the die 10. Specifically, the encapsulant 118 covers the tops of the dielectric patterns 108a and the supports 120a, covers the sidewall of the die 10, and simultaneously covers the tops and sidewalls of the through vias 116.

Figure 3G:
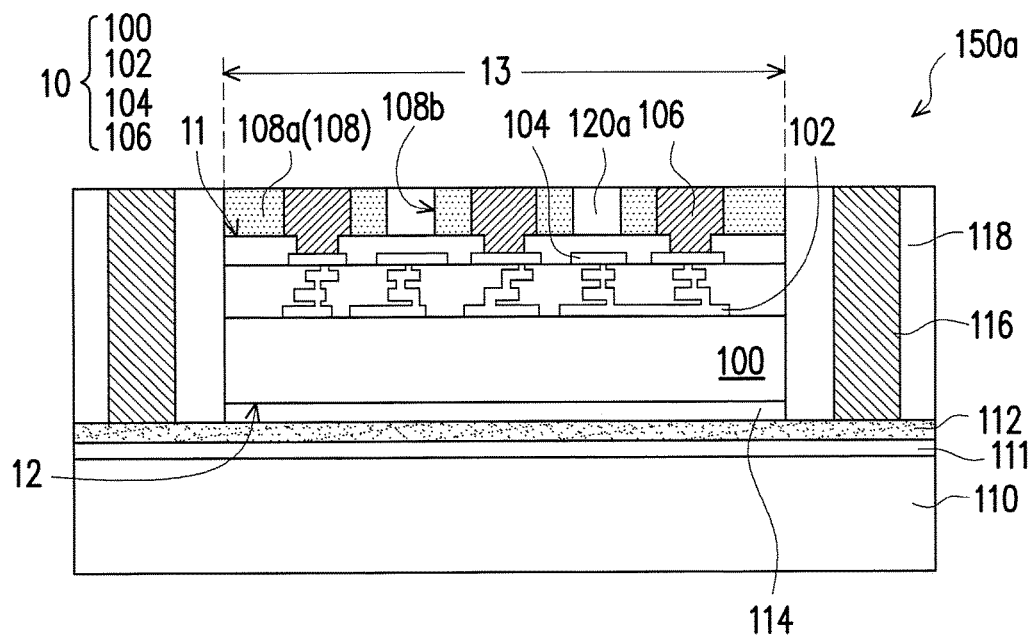

Referring to FIG. 3G and FIG. 4, a portion of the encapsulant 118 is removed until tops of the connectors 106 are exposed (step 314). In some embodiments, a grinding or polishing process is performed to remove a portion of the encapsulant 118, a portion of the dielectric patterns 108a and a portion of the supports 120a by using the connectors 106 as a polishing or grinding stop layer. In some embodiments, the upper portions of the connectors 106 and the through vias 116 are simultaneously removed during the grinding or polishing process if needed. Upon the grinding or polishing process, the tops of the encapsulant 118, the supports 120a and the connectors 106 are substantially coplanar. The package structure 150a of the present disclosure is thus completed.

Figure 3H:
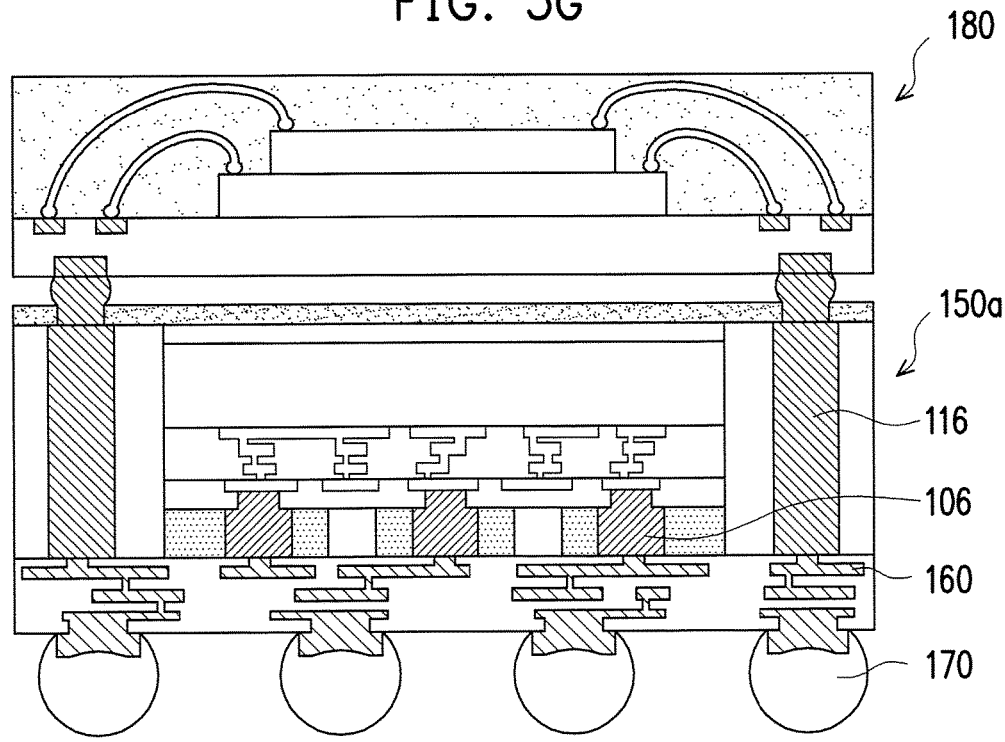

Referring to FIG. 3H, the package structure 150a of the present disclosure can be connected to another package structure 180, so as to form a PoP device.

It is noted that in some embodiments, the supports 120a and the encapsulant 118 are formed from different materials but exhibit substantially the same grinding rate, and the total of top areas of the supports 120a is more than about 30 percent or 50 percent of the total top area of the die 10. In such manner, the equivalent grinding rate of materials resistant to the grinding or polishing process inside the die is similar to that outside the die, so the grinding rate variation inside and outside the die is minimized, and thus, the grinding or polishing uniformity at step 314 is improved.

The package structures of the present disclosure are illustrated with reference to the cross-sectional views of FIG. 1F and FIG. 3G and the top views of FIG. 5 to FIG. 10.

Referring to FIG. 1F and FIG. 3G, a package structure includes a die 10, a dielectric layer 108, an encapsulant 118, a plurality of through vias 116 and a plurality of supports 120/120a. The die 10 includes, over a first side 11 thereof, a plurality of connectors 106. The dielectric layer 108 is over the first side 11 of the die 10 aside or surrounding the connectors 106. The encapsulant 118 is aside or surrounding the die 10. The through vias 116 are aside or around the die and penetrate through the encapsulant 118. The supports 120/120a penetrate through the dielectric layer 108. Besides, the supports 120/120a and the encapsulant 118 have substantially the same grinding rate, but the grinding rate of the supports 120/120a is different from that of the dielectric layer 108.

In some embodiments (e.g., the embodiments of FIG. 1A to FIG. 1G), the supports 120 and the encapsulant 118 include the same material having the same grinding rate. In alternative embodiments (e.g., the embodiments of FIG. 3A to FIG. 3H), the supports 120a and the encapsulant 118 include different materials but exhibit substantially the same grinding rate. In some embodiments, the tops of the encapsulant 118, the supports 120/120a and the connectors 106 are substantially coplanar.

Referring to FIG. 1F, FIG. 3G, FIG. 5 and FIG. 6, the supports 120/120a are pillars arranged in a regular or irregular array. In some embodiments, the adjacent dielectric patterns 108a are connected with each other to form a mesh-shaped dielectric layer 108, and the connectors 106 and the supports 120/120a respectively in pillar array penetrate through the meshes of the dielectric layer 108.

Figure 5:
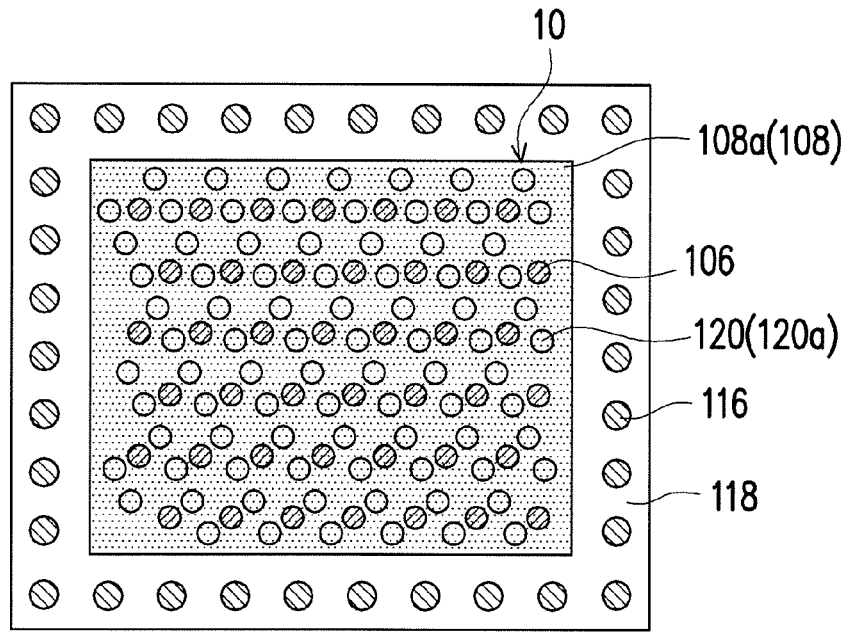
FIG. 5 to FIG. 10 are top views of package structures in accordance with some embodiments.
Figure 6:
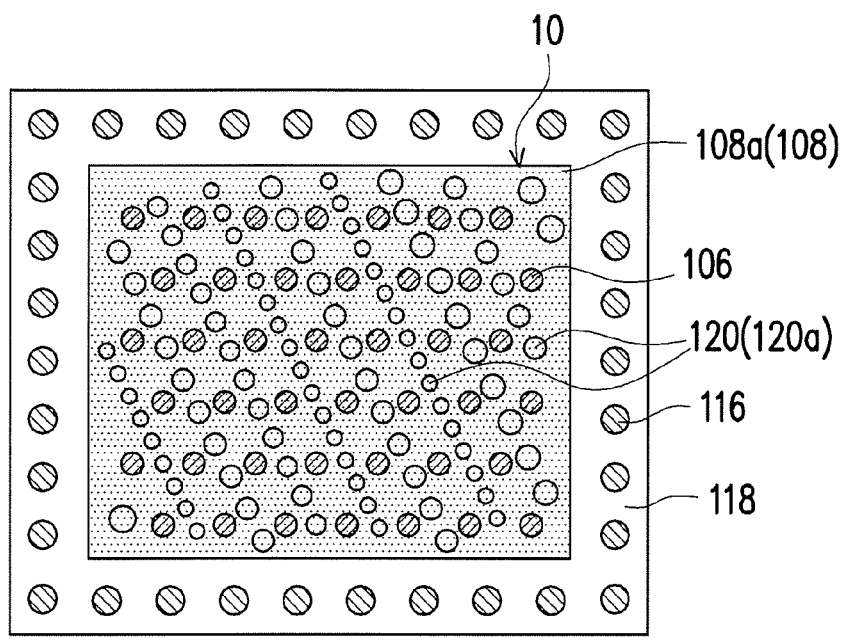

In some embodiments, the supports are formed as round pillars, but the present disclosure is not limited thereto. In alternative embodiments, square pillars or other shaped pillars are used instead of round pillars. In some embodiments, each of the pillars has substantially the same size or top area, as shown in FIG. 5. In alternative embodiments, the supports have different sizes or top areas upon the process requirements, as shown in FIG. 6.

Figure 7:
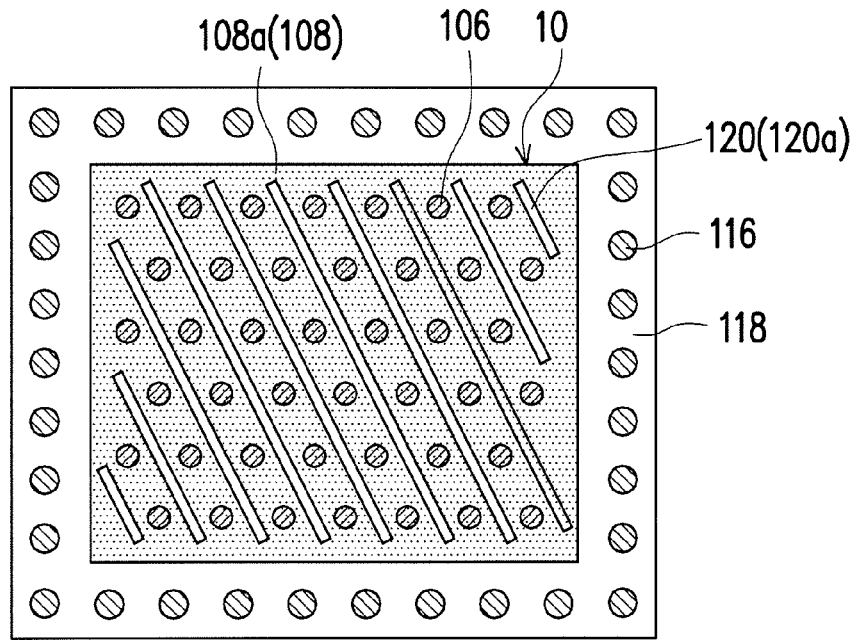

Referring to FIG. 1F, FIG. 3G and FIG. 7, the supports 120/120a are formed as walls. In some embodiments, the connectors 106 are arranged in an array of multiple slanted columns, and one wall is formed aside the connectors 106, e.g., formed between two slanted columns of the connectors 106, as shown in FIG. 7, but the present disclosure is not limited thereto. In alternative embodiments, the connectors 106 are arranged in an array of multiple vertical columns, and one wall is formed between two vertical columns of the connectors 106. In yet alternative embodiments, the connectors 106 are arranged in an array of multiple slanted or vertical rows, and one wall is formed between two slanted or vertical rows of the connectors 106.

Figure 8:
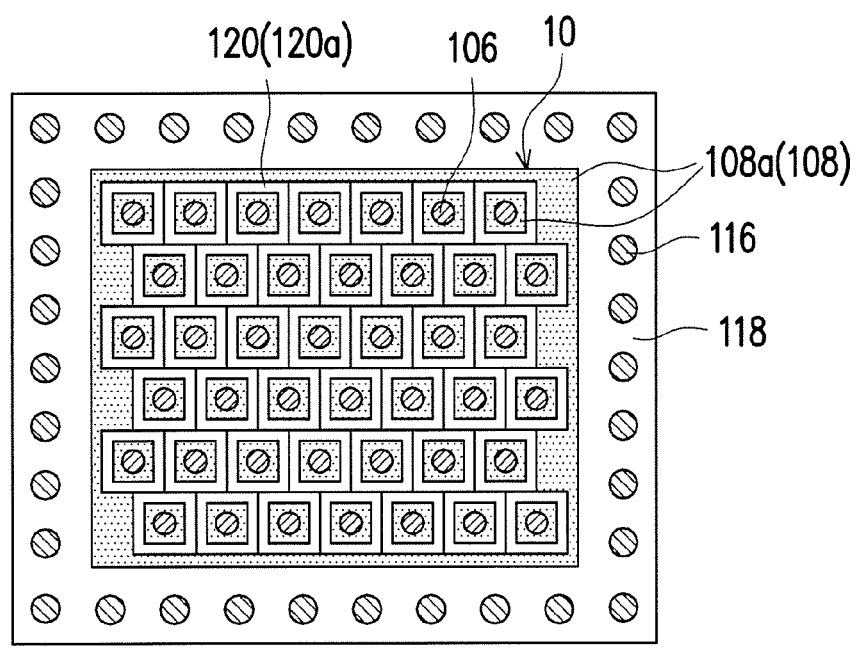
Figure 9:
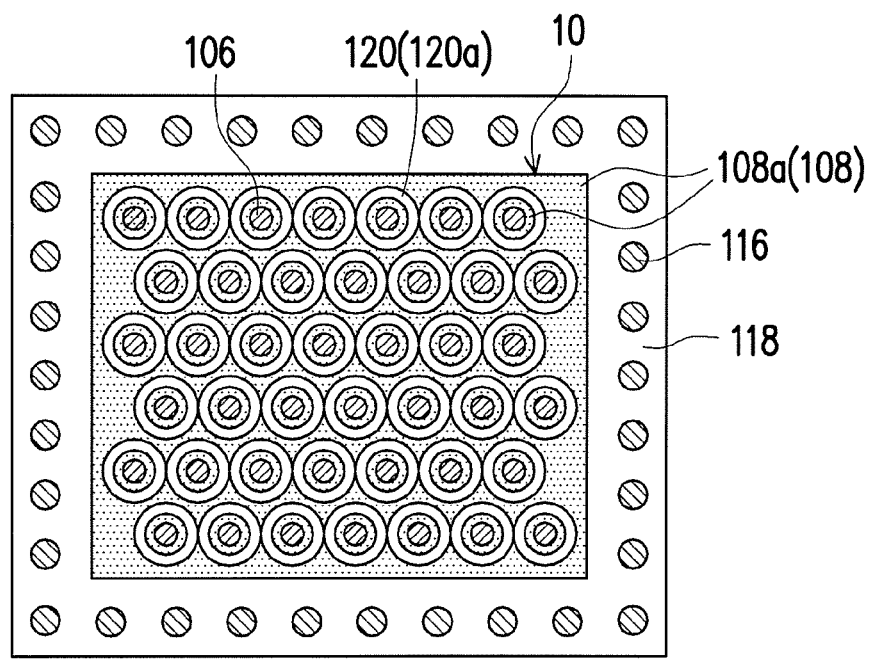

Referring to FIG. 1F, FIG. 3G, FIG. 8 and FIG. 9, the supports 120/120a are rings aside the connectors 106, and dielectric patterns 108a are formed between the supports 120/120a and the connectors 106. In some embodiments, the supports 120/120a are rings respectively surrounding at least one of the connectors 106. In some embodiments, the supports 120/120a are formed as rectangular ring shaped supports, as shown in FIG. 8. In alternative embodiments, the supports 120/120a are formed as circular ring shaped supports, as shown in FIG. 9. In some embodiments, at least a portion of the supports 120/120a are connected to form a net-like structure. In alternative embodiments, the rings are separated from each other.

Figure 10:
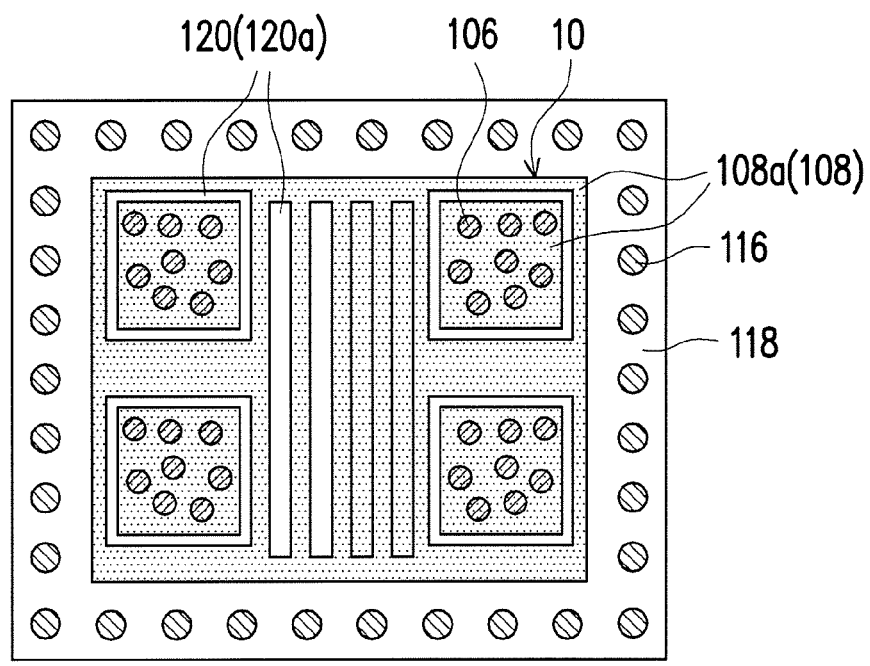

The said embodiments in which the supports are pillars, walls or rings are provided merely for illustration purposes, and are not to be construed as limiting the scope of the present disclosure. In alternative embodiments, other shaped supports or a combination of at least two of the pillars, walls and rings are applicable to the present disclosure. In some embodiments, the supports 120/120a include rings and walls, as shown in FIG. 10, in which each ring-shaped support surrounds a portion of the connectors 106 in the corner or dense region of the die 10, and the walls are formed in the center or open area of the die 10. It is appreciated by people having ordinary skill in the art that other combinations and configurations of the supports are possible. In some embodiments, the supports are distributed evenly in the die region. In alternative embodiments, the supports are distributed randomly and unevenly in the die region. In other words, the shapes, sizes, variations, configurations and distributions of the supports are not limited by the present disclosure.

The supports are contemplated as falling within the spirit and scope of the present disclosure as long as the supports between dielectric patterns aside the connectors inside the die region and the encapsulant outside the die region are provided with the same or similar grinding rate or made of the same or similar material, and the total top area of the supports is more than about 30 percent of the total top area of the die. By such disposition, the equivalent grinding rate of the material(s) inside the die region is substantially the same as the grinding rate of the material(s) outside the die region, so as to minimize the grinding rate variation inside and outside the die during the grinding or polishing process.

In other words, since the supports occupy more than one-third or half of the die area and have a grinding rate similar to that of the encapsulant, the equivalent polishing grinding rate of the supports and the dielectric patterns inside the die region is closer to the grinding rate of the encapsulant outside the die region as compared to the case without supports in the die region. Therefore, the grinding rate resistant to the grinding or polishing process varies slightly from inside to outside of the die, and the polishing uniformity is accordingly improved.

In some embodiments, the step of forming the dielectric layer 108 (or dielectric patterns 108a) is omitted from the method of forming the package structure of the present disclosure.

FIG. 11A to FIG. 11F are cross-sectional views of a method of forming a package structure in accordance with some embodiments. FIG. 12 is a flow chart illustrating a method of forming a package structure in accordance with some embodiments.

Figure 11A:
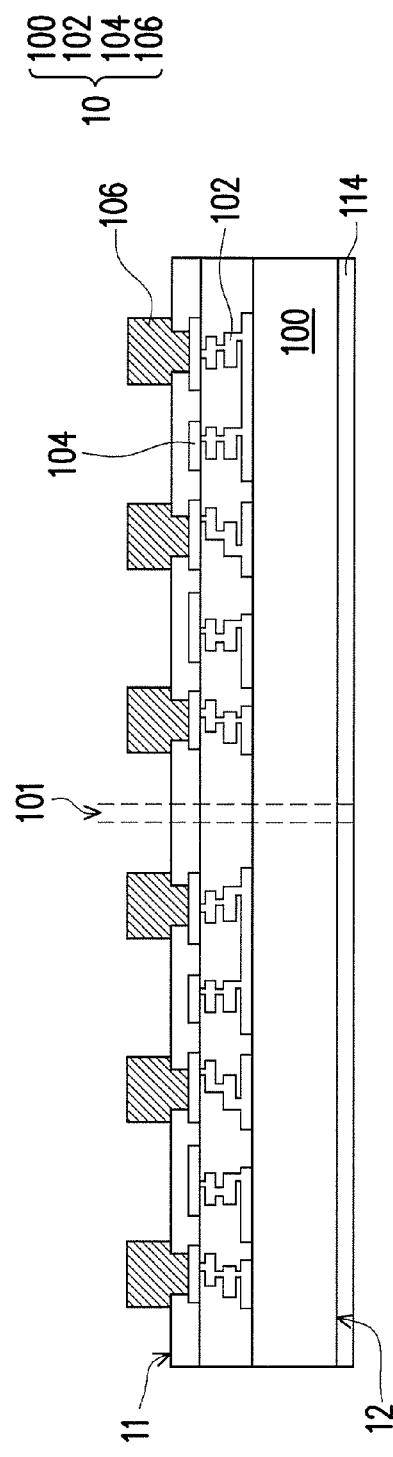
FIG. 11A to FIG. 11F are cross-sectional views of a method of forming a package structure in accordance with some embodiments.
Figure 12:
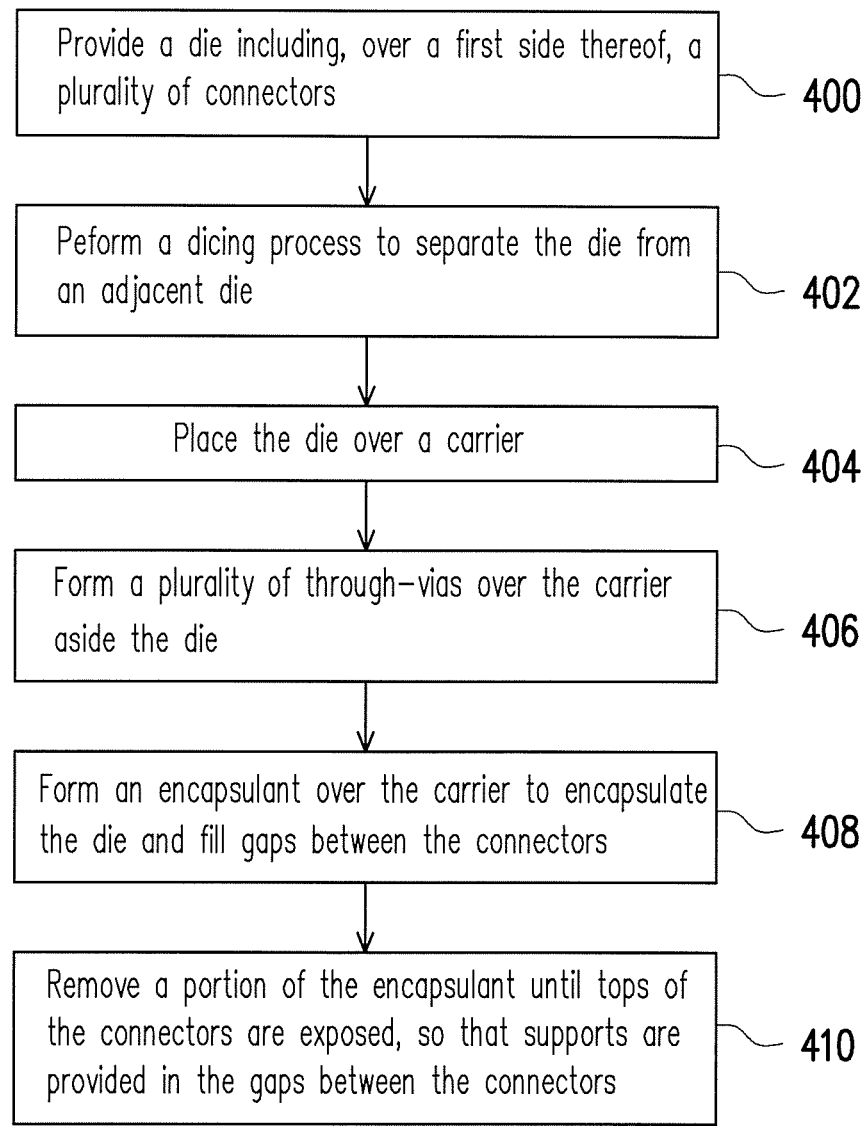
FIG. 12 is a flow chart illustrating a method of forming a package structure in accordance with some embodiments.

Referring to FIG. 11A and FIG. 12, a wafer is provided with a plurality of dies 10, and each die 10 includes, over a first side 11 thereof, a plurality of connectors 106 (step 400).

In some embodiments, before the die singulation process, an adhesive layer 114 such as a DAF is formed over the back sides or second sides 12 of the dies 10, as shown in FIG. 11A.

Figure 11B:
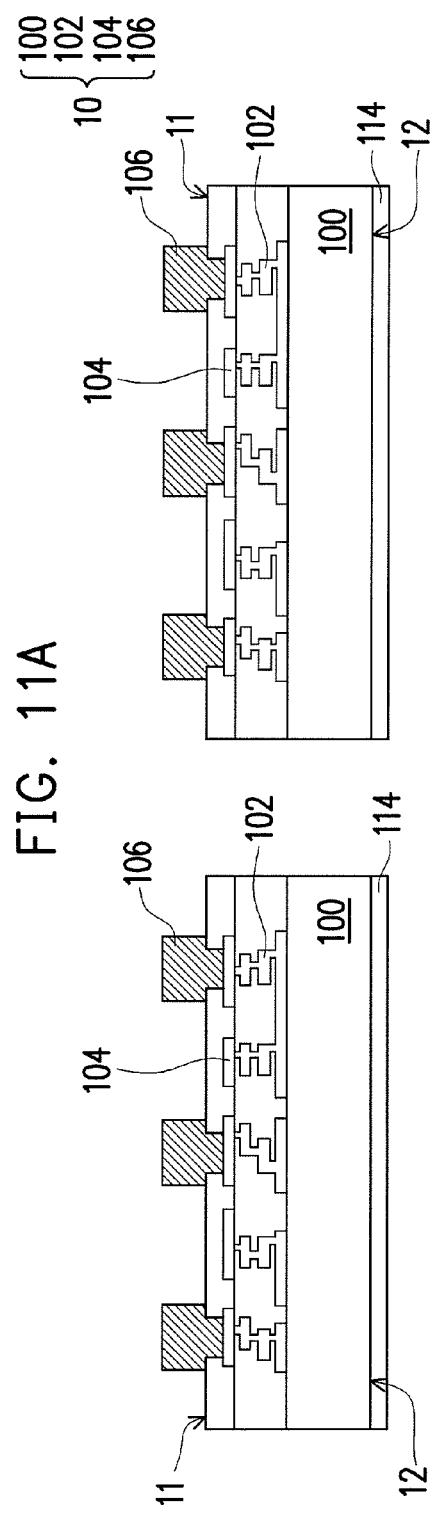

Referring to FIG. 11B and FIG. 12, a dicing process is preformed to separate the die 10 from an adjacent die 10 (step 402).

Figure 11C:
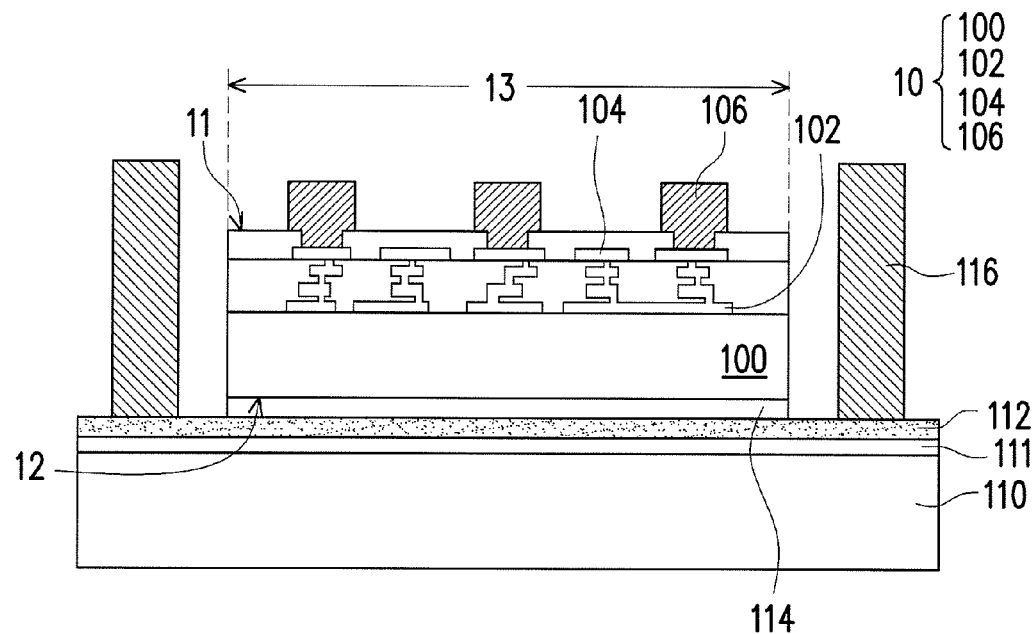

Referring to FIG. 11C and FIG. 12, the die 10 is placed over the carrier 110 (step 404). Thereafter, a plurality of through vias 116 is formed over the carrier 110 aside the die 10 (step 406).

Figure 11D:
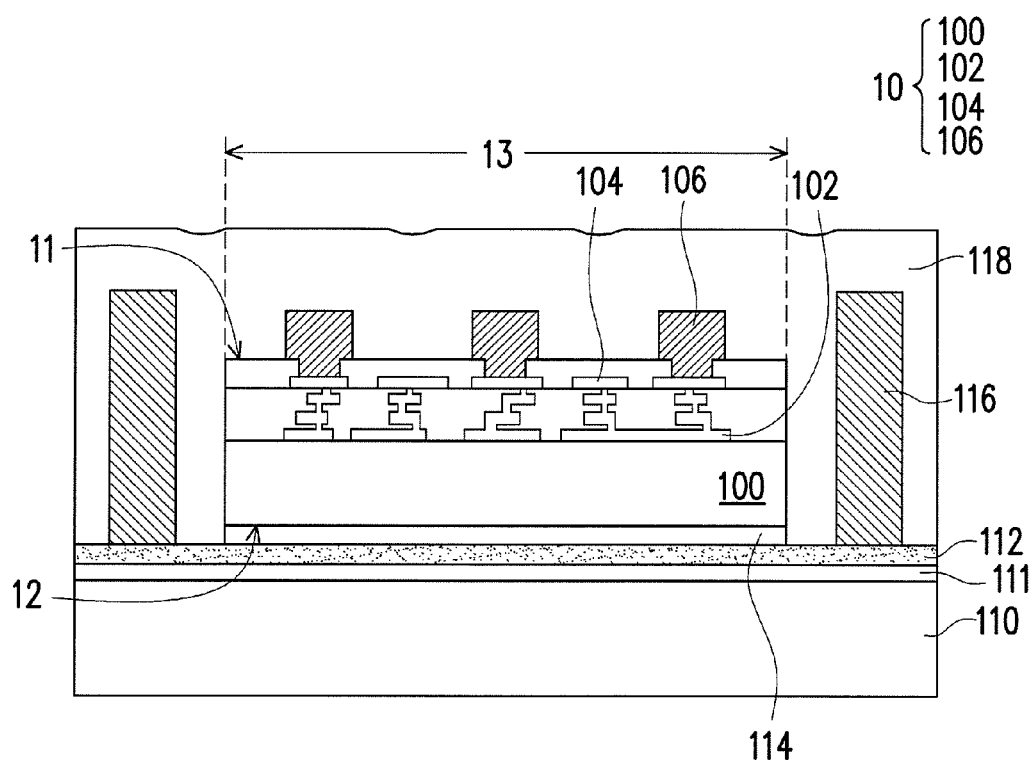

Referring to FIG. 11D and FIG. 12, an encapsulant 118 is formed over the carrier 110 to encapsulate the die 10 and fill gaps between the connectors 106 (step 408). In some embodiments, the encapsulant 118 encapsulates the through vias 116 and encapsulates the top and sidewall of the die 10. Specifically, the encapsulant 118 covers tops and sidewalls of the connectors 106, fills the gaps between the connectors 106, covers the sidewall of the die 10, and simultaneously covers the tops and sidewalls of the through vias 116.

Figure 11E:
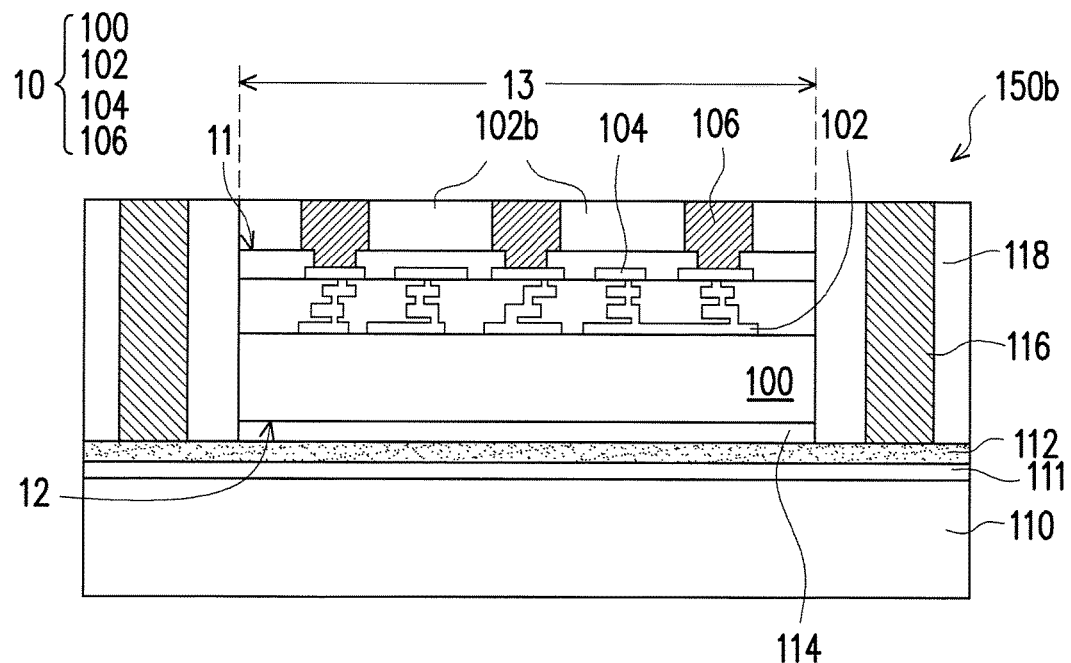

Referring to FIG. 11E and FIG. 12, a portion of the encapsulant 118 is removed until tops of the connectors 106 are exposed, so that supports 120b are respectively in the gaps between the connectors 106 (step 410). In some embodiments, a grinding or polishing process is performed to remove a portion of the encapsulant 118 by using the connectors 106 as a polishing or grinding stop layer. In some embodiments, the upper portions of the connectors 106 and the through vias 116 are simultaneously removed during the grinding or polishing process if needed. Upon the grinding or polishing process, the tops of the encapsulant 118, the supports 120b and the connectors 106 are substantially coplanar. The package structure 150b of the present disclosure is thus completed.

Figure 11F:
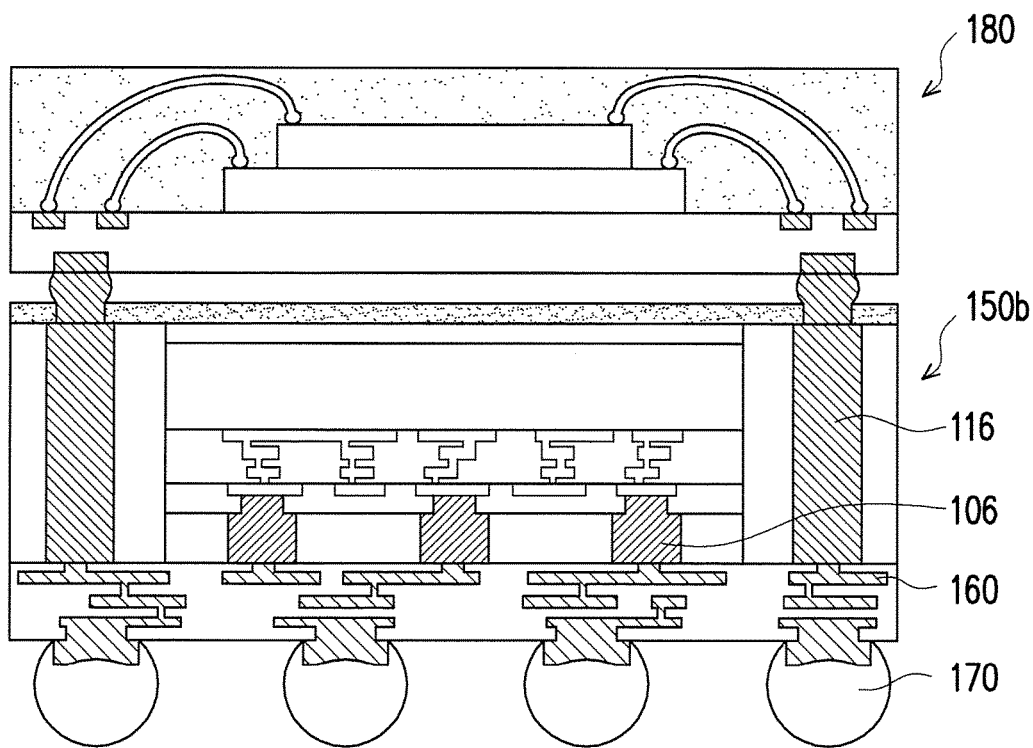

Referring to FIG. 11F, the package structure 150b of the present disclosure can be connected to another package structure 180, so as to form a PoP device.

It is noted that in some embodiments, the supports 120b and the encapsulant 118 are made of the same material with the same grinding rate, and the total of top areas of the supports 120b is more than about 30 percent or 50 percent of the total top area of the die 10. In such manner, the grinding or polishing uniformity at step 410 is improved.

Figure 13:
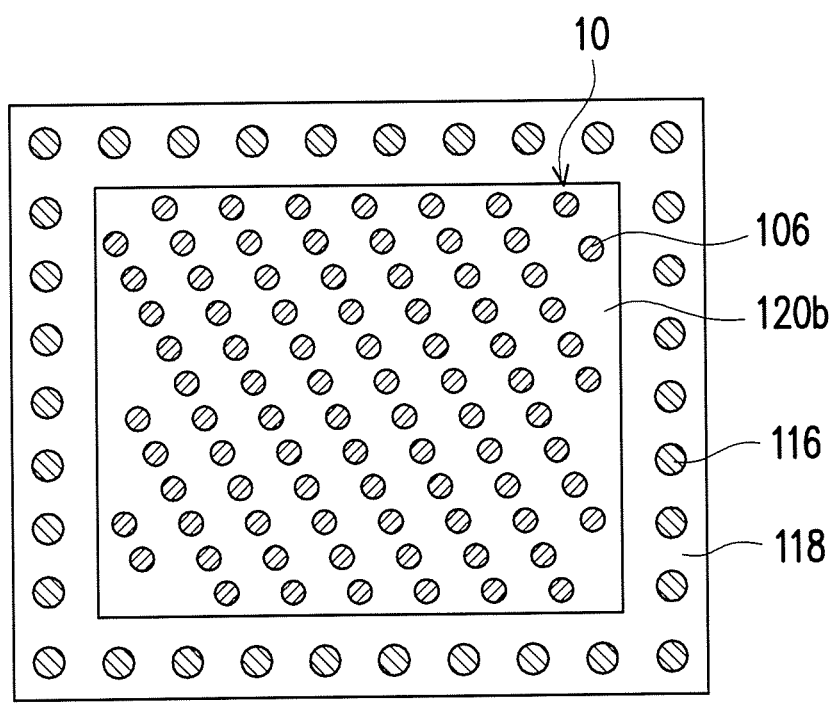
FIG. 13 is a top view of a package structure in accordance with some embodiments.

FIG. 13 is a top view of a package structure in accordance with some embodiments. The supports 120b are connected each other to form a mesh-shaped structure, and the connectors 106 in pillar array penetrate through the meshes of the mesh-shaped structure.

In view of the above, the present disclosure provides package structures having built-in supports and methods of forming the same. The non-conductive supports between dielectric patterns aside topmost connectors inside the die region and the encapsulant outside the die region have substantially the same grinding rate, and the total top area of the supports is more than about 30 percent of the total top area of the die. By such configurations of the present disclosure, the grinding wheel is subjected to less variation in grinding rate during operation, so the polishing uniformity is accordingly improved and the life time of the grinding wheel is prolonged.

In accordance with some embodiments of the present disclosure, a package structure includes a die, a dielectric layer, an encapsulant and a plurality of supports. The die includes at least one connector. The dielectric layer is formed over the die and is aside the connector. The encapsulant is aside the die. The supports are in the dielectric layer aside the connector, wherein a grinding rate of the supports is substantially the same as a grinding rate of the encapsulant but different from a grinding rate of the dielectric layer.

In accordance with alternative embodiments of the present disclosure, a PoP device includes a first package structure and a second package structure. The first package structure includes a die, a dielectric layer, an encapsulant and a plurality of supports. The die includes a plurality of connectors. The dielectric layer is formed over the first side of the die and is aside the connectors. The encapsulant is aside the die. The supports are in the dielectric layer, wherein a material of the supports is the same as a material of the encapsulant. The second package structure is formed overlying the first package structure.

In accordance with yet alternative embodiments of the present disclosure, a method of forming a package structure includes at least the following steps. A die is provided, wherein the die includes, over a first side thereof, a plurality of connectors. A plurality of dielectric patterns is formed over the first side of the die to cover the connectors. The die is placed over a carrier. An encapsulant is formed over the carrier, encapsulates the die and fills gaps between the dielectric patterns. A portion of the encapsulant is removed until tops of the connectors are exposed, so that supports are provided in the gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
a die comprising a connector;
a dielectric layer over the die and aside the connector;
an encapsulant aside the die; and
a plurality of supports in the dielectric layer aside the connector, wherein a material of the support is substantially the same as a material of the encapsulant but different from a material of the dielectric layer, wherein a total of top areas of the supports is about 30 to 70 percent of a total top area of the die.

2. The package structure of claim 1, wherein the supports are pillars arranged in an array.

3. The package structure of claim 1, wherein the supports are walls aside the connector.

4. The package structure of claim 1, wherein the supports are rings aside the connector.

5. The package structure of claim 1, wherein tops of the encapsulant, the supports and the connector are substantially coplanar.

6. The package structure of claim 1, further comprising a plurality of through vias aside the die penetrating through the encapsulant.

7. A PoP device, comprising:
    a first package structure comprising:
        a die comprising a plurality of connectors;
        a dielectric layer over the die and aside the connectors;
        an encapsulant aside the die; and
        a plurality of supports in the dielectric layer, wherein a material of the supports is the same as a material of the encapsulant; and
    a second package structure formed overlying the first package structure,
    wherein the supports are pillars, walls, rings or a combination thereof.

8. The PoP device of claim 7, further comprising a plurality of through vias in the encapsulant.

9. The PoP device of claim 7, wherein the connectors are copper bumps.

10. The PoP device of claim 7, wherein a material of the supports is different from a material of the dielectric layer.

11. The PoP device of claim 7, wherein the total of top areas of the supports is more than about 30 percent of the total top area of the die.

12. A method of forming a package structure, comprising:
    providing a die, wherein the die comprises, over a first side thereof, a plurality of connectors;
    forming a plurality of dielectric patterns over the first side of the die to cover the connectors;
    placing the die over a carrier;
    forming an encapsulant over the carrier, the encapsulant encapsulating the die and filling gaps between the dielectric patterns; and
    removing a portion of the encapsulant until tops of the connectors are exposed, so that supports are provided in the gaps between the dielectric patterns,
    wherein the supports are pillars, walls, rings or a combination thereof.

13. The method of claim 12, wherein the step of forming the dielectric patterns comprises:
    forming a dielectric layer over the first side of the die to cover the connectors and fill gaps between the connectors; and
    patterning the dielectric layer to from the dielectric patterns.

14. The method of claim 12, further comprising performing a dicing process to separate the die from an adjacent die after the dielectric patterns are formed.

15. The method of claim 12, further comprising, after the step of placing the die over the carrier and before the step of forming the encapsulant over the carrier, forming a plurality of through vias over the carrier aside the die.

16. The method of claim 12, wherein a total of top areas of the supports is more than about 30 percent of a total top area of the die.

* * * * *